(12) United States Patent
Wu et al.

(10) Patent No.: US 12,426,431 B1
(45) Date of Patent: Sep. 23, 2025

(54) OPTICAL MODULE AND OPTICAL DEVICE

(71) Applicant: Shenzhen Huadian Lighting Co., Ltd., Shenzhen (CN)

(72) Inventors: Dongwei Wu, Shenzhen (CN); Huadong Wu, Shenzhen (CN); Guangfa Zhang, Shenzhen (CN); Wei Kang, Shenzhen (CN)

(73) Assignee: Shenzhen Huadian Lighting Co., Ltd., Shenzhen (CN)

( * ) Notice: Subject to any disclaimer, the term of this patent is extended or adjusted under 35 U.S.C. 154(b) by 0 days.

(21) Appl. No.: 19/094,943

(22) Filed: Mar. 30, 2025

(30) Foreign Application Priority Data

Nov. 7, 2024 (CN) .......................... 202411578886.8

(51) Int. Cl.
*H10H 29/14* (2025.01)
*H10H 29/855* (2025.01)

(52) U.S. Cl.
CPC ........ *H10H 29/142* (2025.01); *H10H 29/855* (2025.01)

(58) Field of Classification Search
CPC .......................... H10H 29/142; H10H 29/855
See application file for complete search history.

(56) References Cited

U.S. PATENT DOCUMENTS

2014/0306245 A1* 10/2014 Hayashi .............. H01L 25/0753 257/98
2018/0351034 A1* 12/2018 Kuo ..................... H10H 20/812

FOREIGN PATENT DOCUMENTS

| CN | 101995592 A | 8/2012 |
| CN | 102230980 A | 6/2013 |
| CN | 103672568 A | 3/2014 |
| CN | 102252264 A | 3/2015 |
| CN | 204879546 U | 12/2015 |
| CN | 206637553 U | 11/2017 |
| CN | 207213658 U | 4/2018 |
| CN | 108716653 A | 10/2018 |
| CN | 208794110 U | 4/2019 |
| CN | 212029390 U | 11/2020 |
| CN | 115931809 A | 4/2023 |
| CN | 219735098 U | 9/2023 |
| CN | 220526947 U | 2/2024 |
| CN | 118110946 A | 5/2024 |
| CN | 118473184 A | 8/2024 |
| CN | 119092495 A | 12/2024 |

* cited by examiner

*Primary Examiner* — Ratisha Mehta
(74) *Attorney, Agent, or Firm* — Hawaii Patent Services; Nathaniel K. Fedde; Kenton N. Fedde

(57) ABSTRACT

The present invention discloses an optical module and an optical device, the optical module comprising a substrate, lenses, and optical components, wherein the substrate comprise mounting portions; the lenses cover the mounting portions, the lenses have a central axis perpendicular to a surface of the mounting portions, central cross sections of the lenses along the central axis are arc-shaped surfaces; the optical components comprise first light-emitting chips at an intersection of the central axis and the mounting portions, and second light-emitting chips disposed between the first light-emitting chips and a periphery of the lenses, the first light-emitting chips and the second light-emitting chips being configured to be independently activable. The optical module of the technical solution of the present invention enables flexible switching of multiple light-emitting angles.

4 Claims, 8 Drawing Sheets excellent# OPTICAL MODULE AND OPTICAL DEVICE

INCORPORATION BY REFERENCE

This application claims the benefit of priority from China Patent Application No. 2024115788868 filed on Nov. 7, 2024, the contents of which are hereby incorporated by reference in their entirety.

TECHNICAL FIELD

The present invention relates to the technical field of optical elements, and in particular to an optical module and an optical device.

BACKGROUND TECHNOLOGY

A light emission angle of an optical element refers to an included angle between light emitted by a light source and a central axis of the light source, which determines a distribution range and lighting effect of light. Required luminous angle may vary in different application scenarios. For example, for spotlights, a smaller light emission angle is required to produce a concentrated beam, and for ambient lighting, a larger light emission angle is required to provide uniform illumination. Therefore, an optical module capable of providing a variety of light emission angles has a significant advantage in meeting diverse lighting requirements.

Existing single LED lamps usually consist of parts such as light-emitting chips, lenses and substrates, with the light-emitting chip mounted on the substrate, and lens covers arranged above the light-emitting chip for controlling a direction of light emission. However, there are obvious limitations to this structure. Since positions of these parts are fixed, especially a relative position between the light-emitting chip and the lenses cannot be adjusted, resulting in a single optical element that can only produce a single light-emitting angle. This fixed structural design makes it impossible for a single LED lamp to achieve multiple light-emitting angles, making it difficult to adapt to lighting requirements under different lighting scenarios.

SUMMARY OF THE INVENTION

The main purpose of the present invention is to solve the technical problem that a single LED lamp cannot generate a plurality of luminous angles in the prior art.

A first aspect of the present invention provides an optical module comprising a substrate, lenses, and optical components;
  the substrate comprise mounting portions;
  the lenses cover the mounting portions, the lenses have a central axis perpendicular to a surface of the mounting portions, central cross sections of the lenses along the central axis are arc-shaped surfaces;
  the optical components comprise first light-emitting chips at an intersection of the central axis and the mounting portions, and second light-emitting chips disposed between the first light-emitting chips and a periphery of the lenses, the first light-emitting chips and the second light-emitting chips being configured to be independently activable.

Optionally, thicknesses of the lenses gradually increase from the central axis toward a periphery direction of the lenses.

Optionally, the lenses comprise inner arcuate surfaces and outer arcuate surfaces opposite to each other, the inner arcuate surfaces being disposed close to the mounting portions relative to the outer arcuate surfaces;
  the inner arcuate surfaces are spherical surfaces, and a curvature of the outer arcuate surfaces gradually increases from the central axis toward the periphery direction of the outer arcuate surfaces.

Optionally, a color temperature of the first light-emitting chips and the color temperature of the second light-emitting chips are different from each other.

Optionally, the substrate has a plurality of the mounting portions on a same side surface;
  numbers of the lenses correspond exactly to the numbers of the mounting portions, with each lens covering each corresponding mounting portion;
  the numbers of the plurality of optical components correspond exactly to the numbers of the mounting portions, each first light-emitting chip of each optical component is mounted at the intersection of the central axis of a corresponding lens and the corresponding mounting portion, and each second light-emitting chip of each optical component is mounted between the central axis of the corresponding lens and the periphery of the corresponding lens.

Optionally, the lenses comprise central light condensing portions overlapping with orthographic projections of the first light emitting chips on the substrate and peripheral diffusing portions connected to the central light condensing portions and the substrate, respectively, surfaces of the central light condensing portions are provided with light condensing microstructures, and surfaces of the peripheral diffusing portions are provided with diffusion microstructures;
  the light condensing microstructures are configured to refract and converge light beams irradiated on the central light condensing portions to the central axis, and the diffusion microstructures is configured to refract and deviate light beams irradiated on the peripheral diffusing portions from the central axis.

Optionally, the light condensing microstructures comprise condensing annular grooves surrounding the central axis, groove wall surfaces of the condensing annular grooves comprise condensing inner annular surfaces and condensing outer annular surfaces opposite to each other, the condensing inner annular surfaces are disposed opposite to the condensing outer annular surfaces and close to the central axis;
  the condensing outer annular surfaces are inclined in a direction close to the central axis in a direction from a bottom portion to an opening portion of the condensing annular grooves, and the condensing inner annular surfaces are inclined in a direction perpendicular to a surface of the mounting portions or away from the central axis in the direction from the bottom portion to the opening portion of the condensing annular grooves.

Optionally, condensing inner annular surfaces and the condensing outer annular surfaces are both planar;
  when the condensing inner annular surfaces are inclined in a direction away from the central axis in the direction from the bottom portion to the opening portion of the condensing annular grooves, an included angle between the condensing inner annular surfaces and the central axis is smaller than an included angle between the condensing outer annular surfaces and the central axis.

Optionally, the diffusion microstructures comprise diffusion annular grooves surrounding the central axis, groove wall surfaces of the diffusion annular grooves comprise diffusion inner annular surfaces and diffusion outer annular surfaces opposite to each other, and the diffusion inner annular surfaces are disposed opposite to the diffusion outer annular surfaces and close to the central axis;

the diffusion outer annular surfaces are inclined in a direction away from the central axis in a direction from a bottom portion to an opening portion of the diffusion annular grooves, and the diffusion inner annular surfaces are inclined in a direction perpendicular to a surface of the mounting portions or in a direction away from the central axis in a direction from the bottom portion to the opening portion of the condensing annular grooves.

A second aspect of the present invention provides an optical device comprising an optical module comprising a substrate, lenses, and optical components;

the substrate comprises mounting portions;

the lenses cover the mounting portions, the lenses have a central axis perpendicular to a surface of the mounting portions, central cross sections of the lenses along the central axis are arc-shaped surfaces;

the optical components comprise first light-emitting chips at an intersection of the central axis and the mounting portions, and second light-emitting chips disposed between the first light-emitting chips and a periphery of the lenses, the first light-emitting chips and the second light-emitting chips being configured to be independently activable.

The technical solution provided by the embodiments of the present application has at least following advantages:

When the first light-emitting chips (located on the central axis) are lit alone, light is emitted mainly through a central portion of the lenses because the first light-emitting chips are located at a center position of the lenses. This arrangement allows rays to be symmetrically distributed around the lenses, creating a uniform pattern of luminescence, creating a distribution of a light field that is symmetrical to the central axis. When the second light-emitting chips (located between the first light-emitting chips and the periphery of the lenses) are illuminated alone, light emitted by the second light-emitting chips is mainly emitted through an off-center portion of the lenses. This asymmetrical arrangement causes light to be concentrated mainly on one side of the lenses, creating a directional, asymmetrical light field distribution. This distribution is in sharp contrast to the symmetrical distribution when the first light-emitting chips are lit alone, providing a completely different pattern of light emission. When the first light-emitting chips and the second light-emitting chips are lit simultaneously, two different light field distributions are superimposed and influenced on each other. A symmetrical light field provided by center chips combines with an asymmetrical light field provided by edge chips, resulting in a more complex and unique light field distribution. This combined effect provides users with a third unique lighting mode, which is significantly different in light intensity distribution and coverage than when a single chip is lit.

The diversity of this light emission mode is mainly determined by shapes of the lenses and positions of the chips. Central sections of the lenses along the central axis are arc-shaped surfaces, with a change of curvature from a center portion to an edge portion affecting the way light is refracted. Different refraction effects are created when light sources at different locations pass through different parts of the lenses, resulting in different light field distributions. In addition, since two chips can be activated independently, users can flexibly adjust the light emission mode without changing the lenses or using complex mechanical structures. This design not only overcomes limitation of a single light emission mode of traditional single LED lamp, but also avoids high cost and volume problems caused by using multiple LED lamps or complex mechanical structures, which provides an efficient and flexible solution for diverse lighting requirements, achieving a variety of different lighting effects by a single optical module.

BRIEF DESCRIPTION OF THE DRAWINGS

In order to more clearly explain the embodiments of the present invention or the technical solutions in the prior art, the drawings that need to be used in the description of the embodiments or the prior art will be briefly introduced below, and it is obvious that the drawings in the following description are only some embodiments of the present invention, and for those skilled in the art, other drawings can be obtained according to the structures shown in these drawings without making creative labor.

Figure 1:
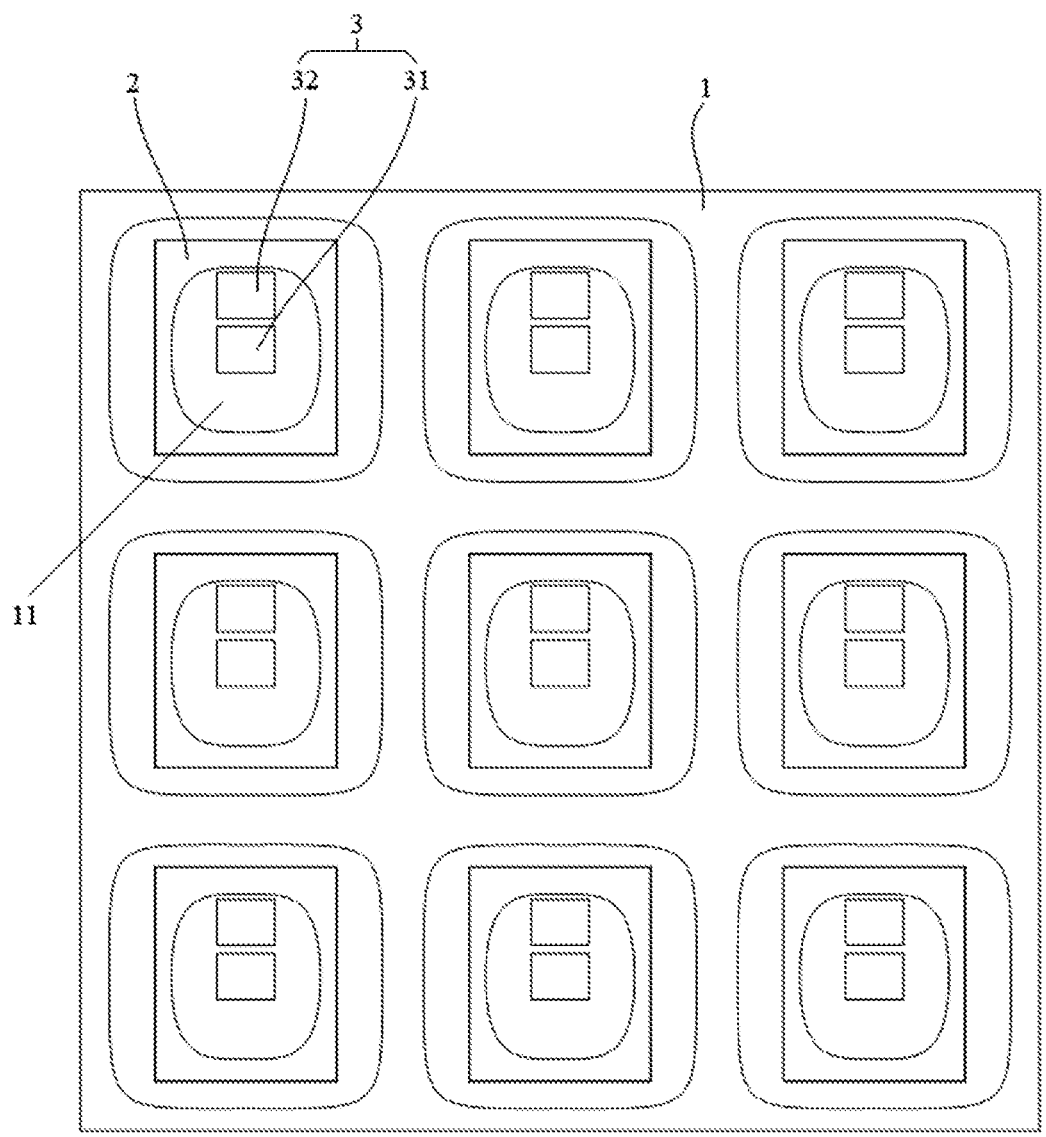
FIG. 1 is a schematic structural diagram of an optical module according to an embodiment of the present invention.

The reference signs in the drawings are indicated as follows:

1—substrate; 11—mounting portion; 2—lenses; 21—central axis; 22—inner arcuate surface; 23—outer arcuate surface; 24—central light condensing portion; 241—light condensing microstructure; 241a—condensing annular groove; 241b—condensing inner annular surface; 241c—condensing outer annular surface; 25—peripheral diffusing portion; 251—diffusion microstructure; 251a—diffusion annular groove; 251b—diffusion inner annular surface; 251c—diffusion outer annular surface; 3—optical component; 31—first light-emitting chip; 32—second light-emitting chip.

The realization of the object, functional features and advantages of the present invention will be further described in conjunction with embodiments with reference to the accompanying drawings.

Specific Embodiments

The technical solutions in the embodiments of the present invention will be clearly and completely described with reference to the drawings in the embodiments of the present invention, and it is obvious that the described embodiments are only a part of the embodiments of the present invention, but not all the embodiments. Based on the embodiments in the present invention, all other embodiments obtained by those skilled in the art without creative work fall within the scope of protection of the present invention.

It should be noted that if the embodiment of the present invention involves a directional indication (such as up, down, left, right, front, rear, etc.), the directional indication is only used to explain the relative positional relationship, movement, etc. between the components under a specific posture (as shown in the drawings). If the specific posture is changed, the directional indication is changed accordingly.

In addition, descriptions referring to "first", "second", etc. in the present invention are for descriptive purposes only, and should not be understood as indicating or implicitly indicating the relative importance or as implicitly specifying the number of technical features indicated. Thus, a feature defined as "first" or "second" may explicitly or implicitly comprises at least one of the features. In addition, "and/or" in the whole text includes three solutions: a technical solution taking A and/or B as an example, including a technical solution A, a technical solution B, and a technical solution satisfying both A and B. In addition, the technical solutions of each embodiment can be combined with each other, and it must be based on the fact that a person skilled in the art can realize it. When the combination of technical solutions conflicts with each other or cannot be realized, it should be considered that the combination of technical solutions does not exist and does not fall within the scope of protection claimed by the present invention.

An embodiment of the present invention provides an optical module, and the optical module provided in the embodiment of the present invention will be described in detail below in connection with the accompanying drawings.

Figure 2:
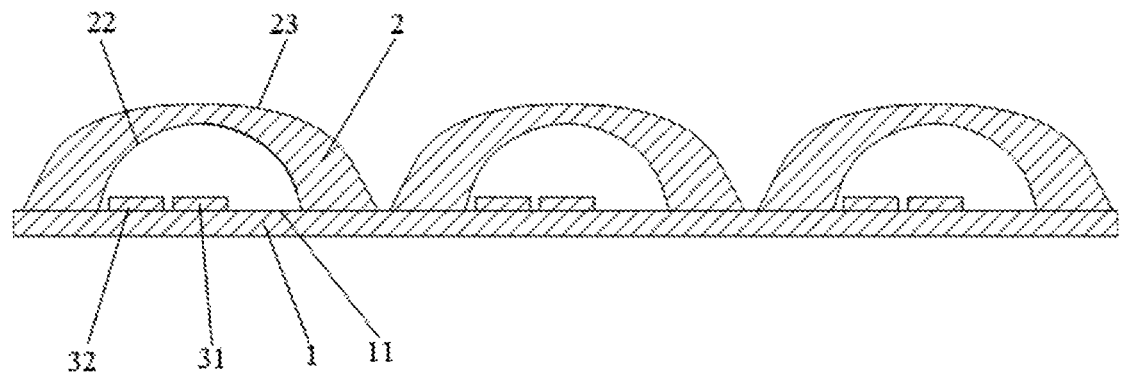
FIG. 2 is a sectional view of the optical module according to an embodiment of the present invention.
Figure 3:
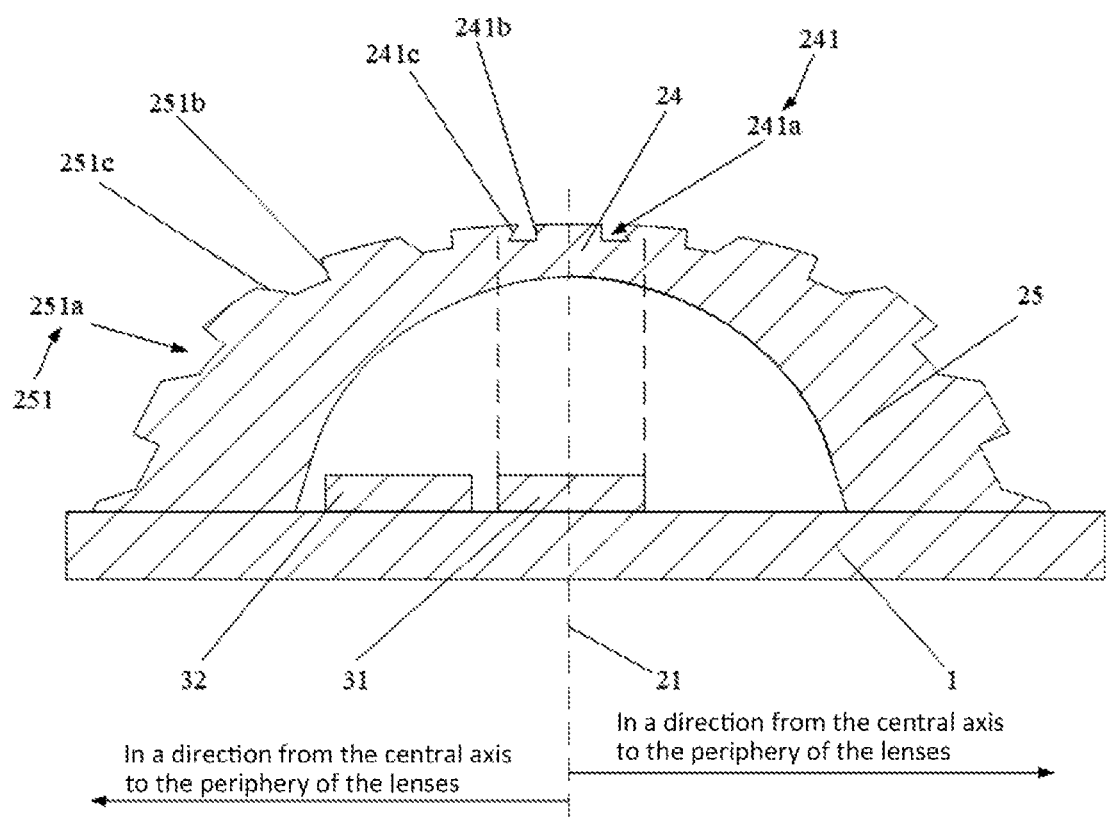
FIG. 3 is a sectional view of the optical module according to another embodiment of the present invention.
Figure 4:
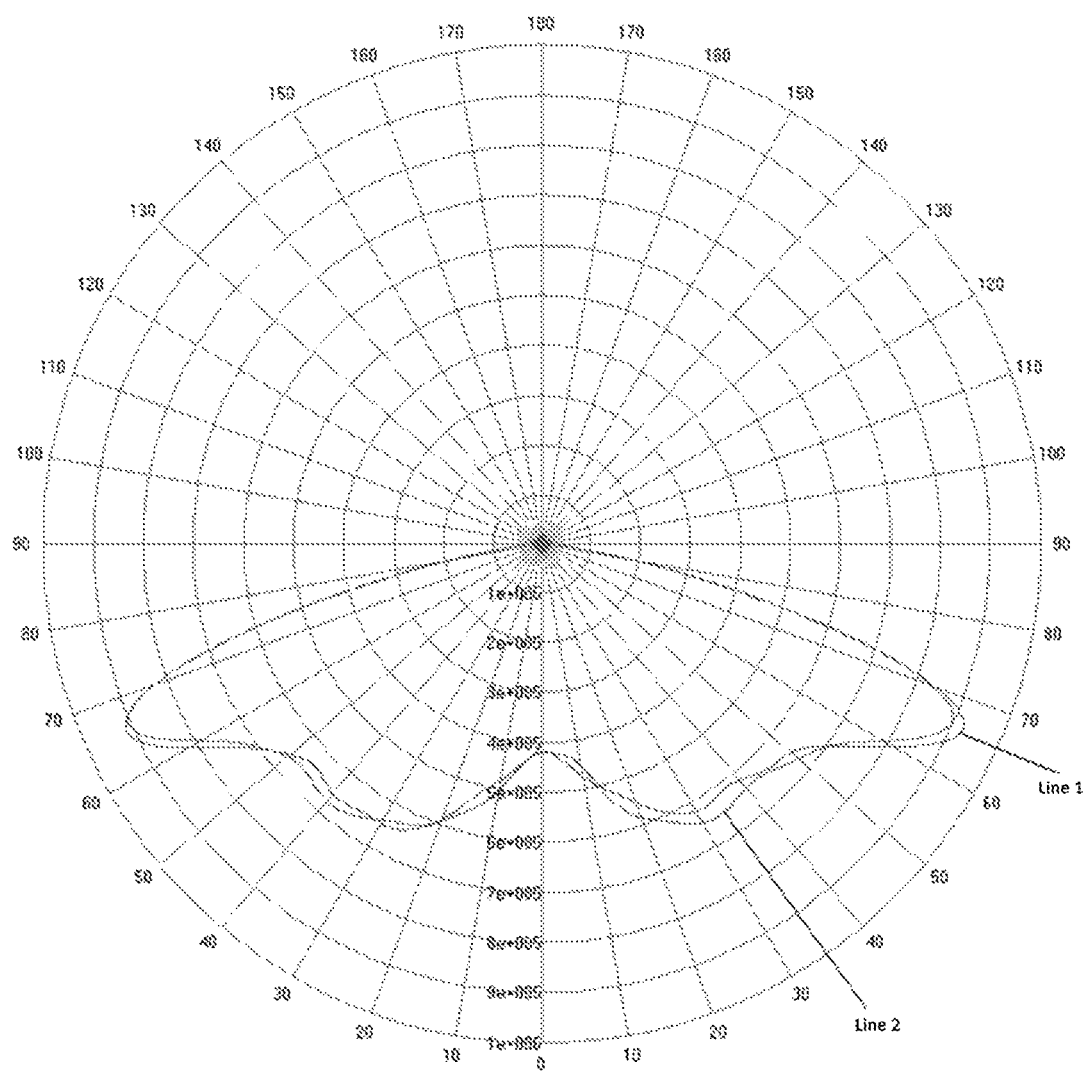
FIG. 4 is a diagram illustrating a light intensity distribution of light refracted by lenses when the first light-emitting chips are lit alone.
Figure 5:
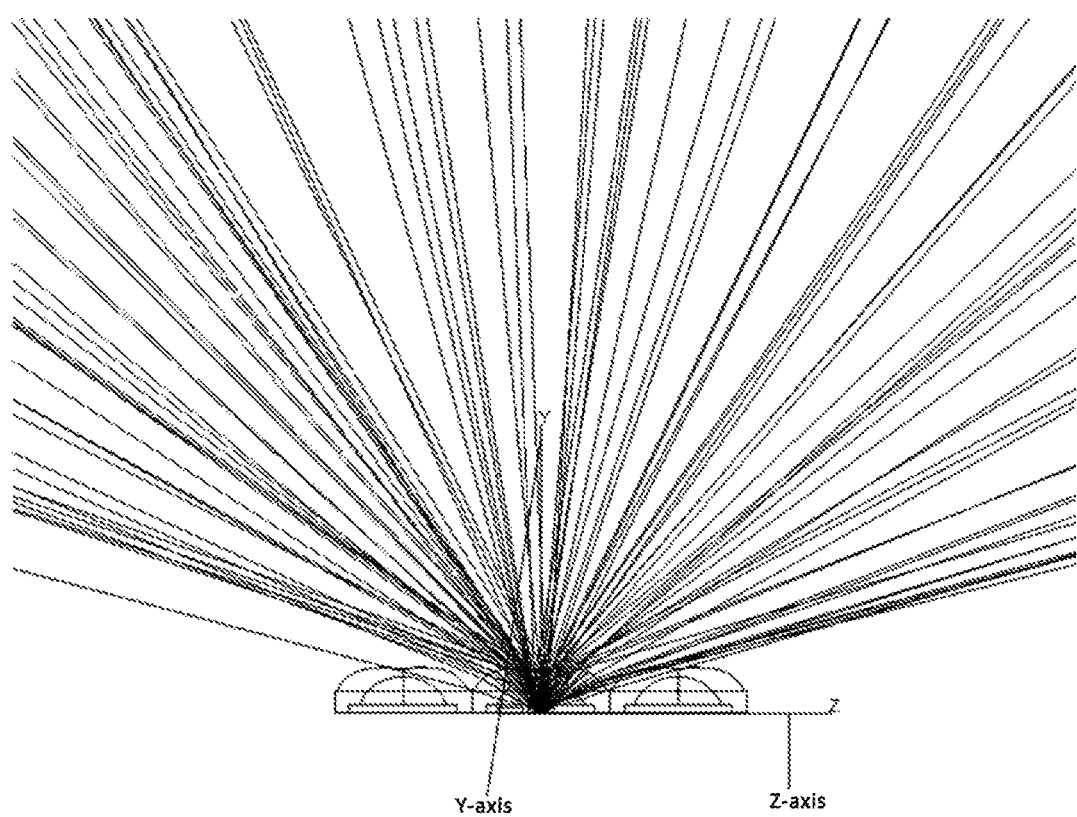
FIG. 5 is a light distribution diagram when the first light-emitting chips are lit alone.
Figure 6:
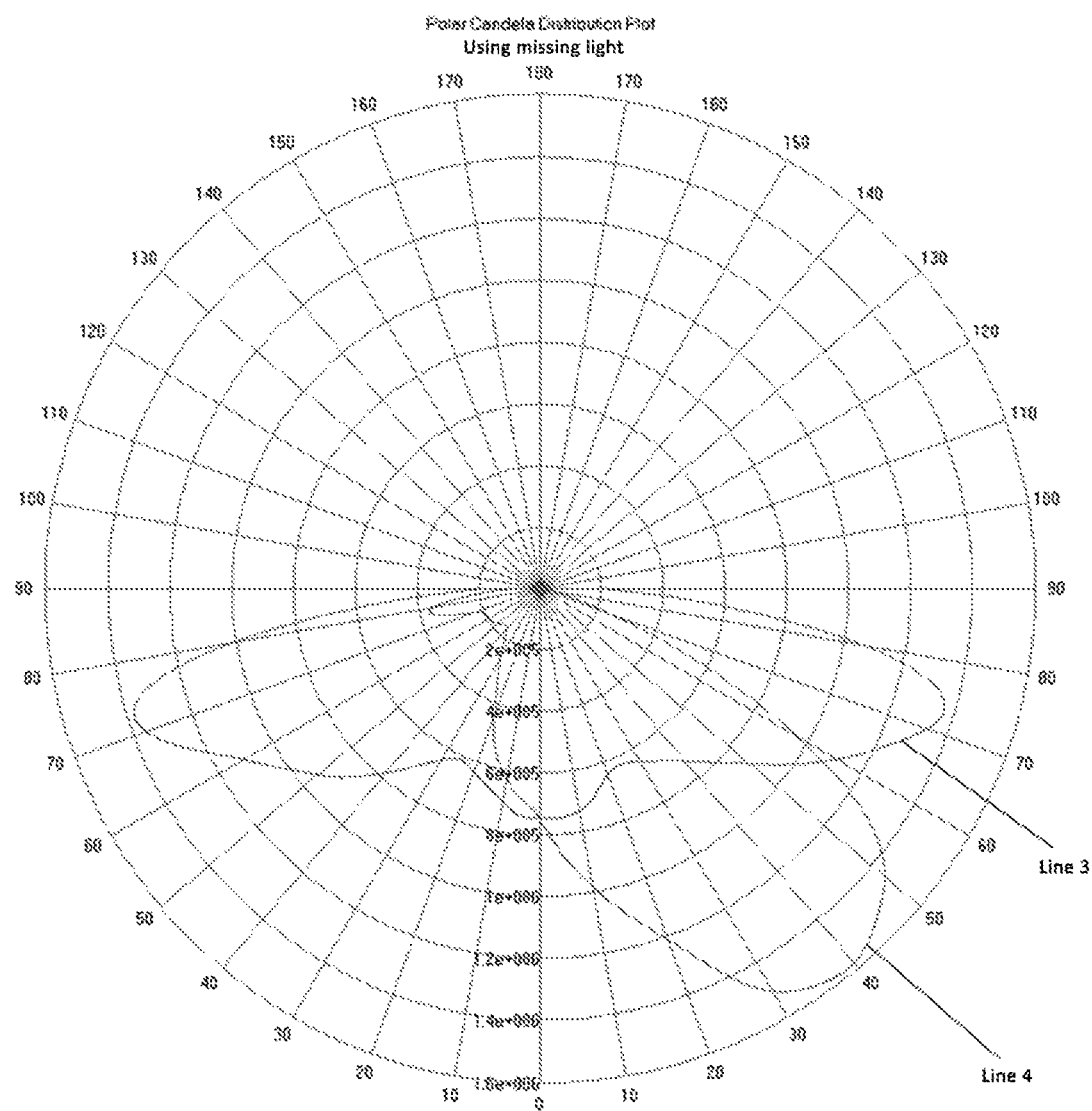
FIG. 6 is a diagram illustrating the light intensity distribution of light refracted by lenses when the second light-emitting chips are lit alone.
Figure 7:
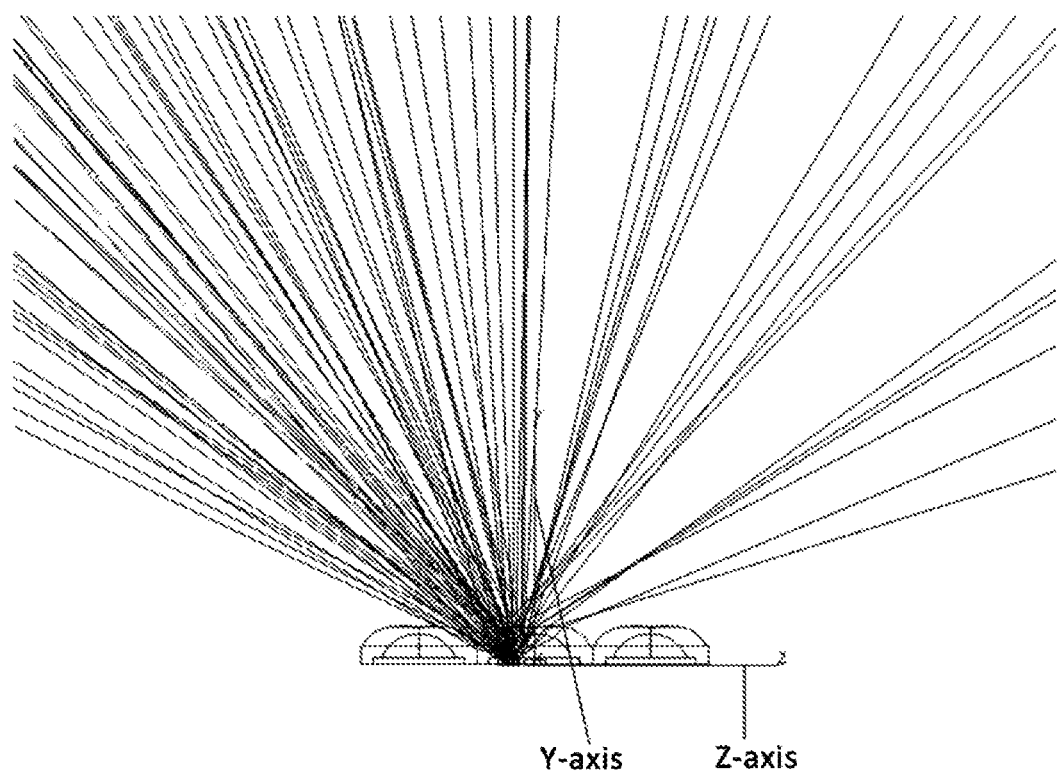
FIG. 7 is a light distribution diagram when the second light-emitting chips are lit alone.
Figure 8:
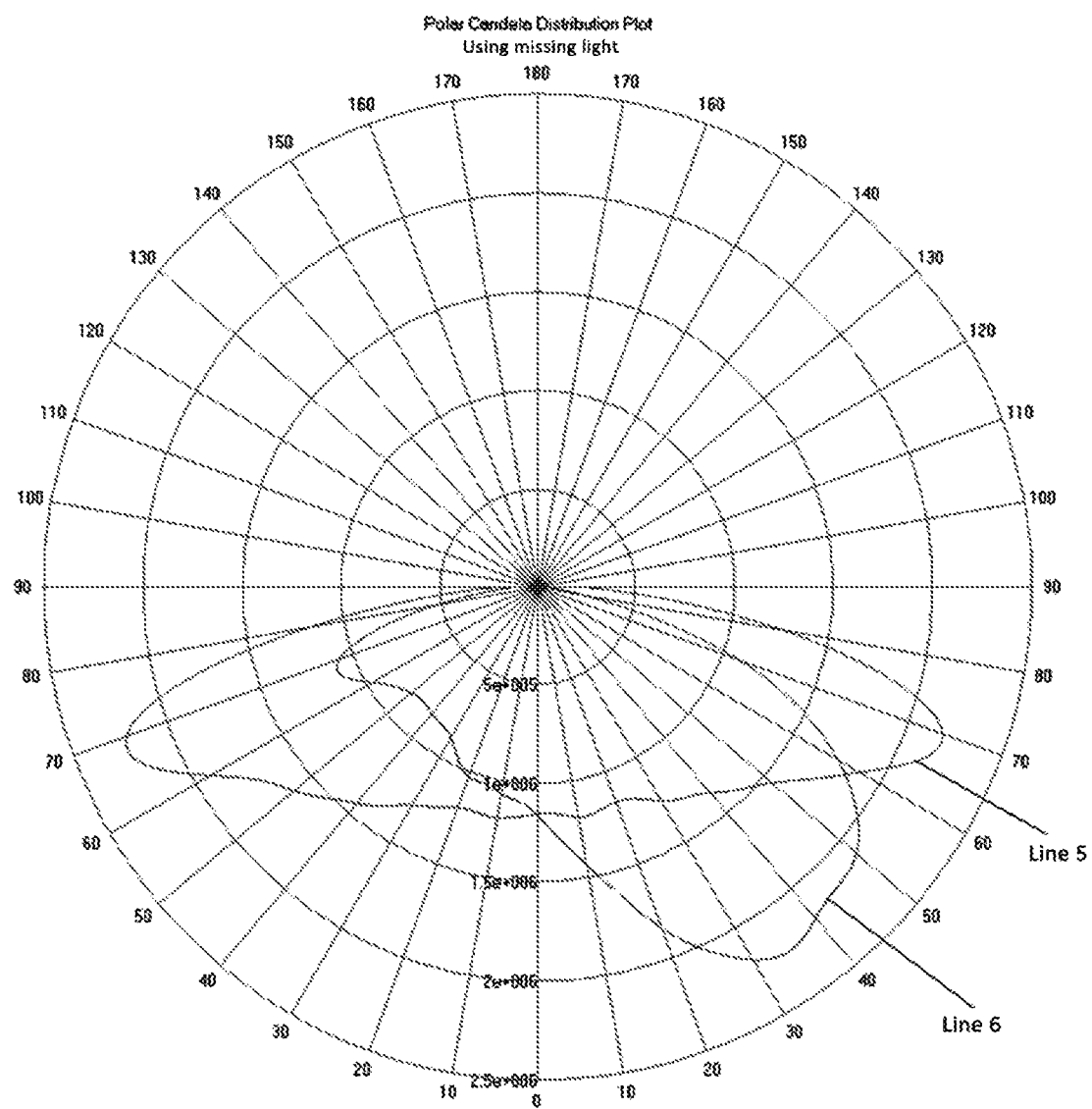
FIG. 8 is a diagram illustrating a light intensity distribution diagram of light refracted by lenses when the first light-emitting chips and the second light-emitting chips are lit simultaneously.
Figure 9:
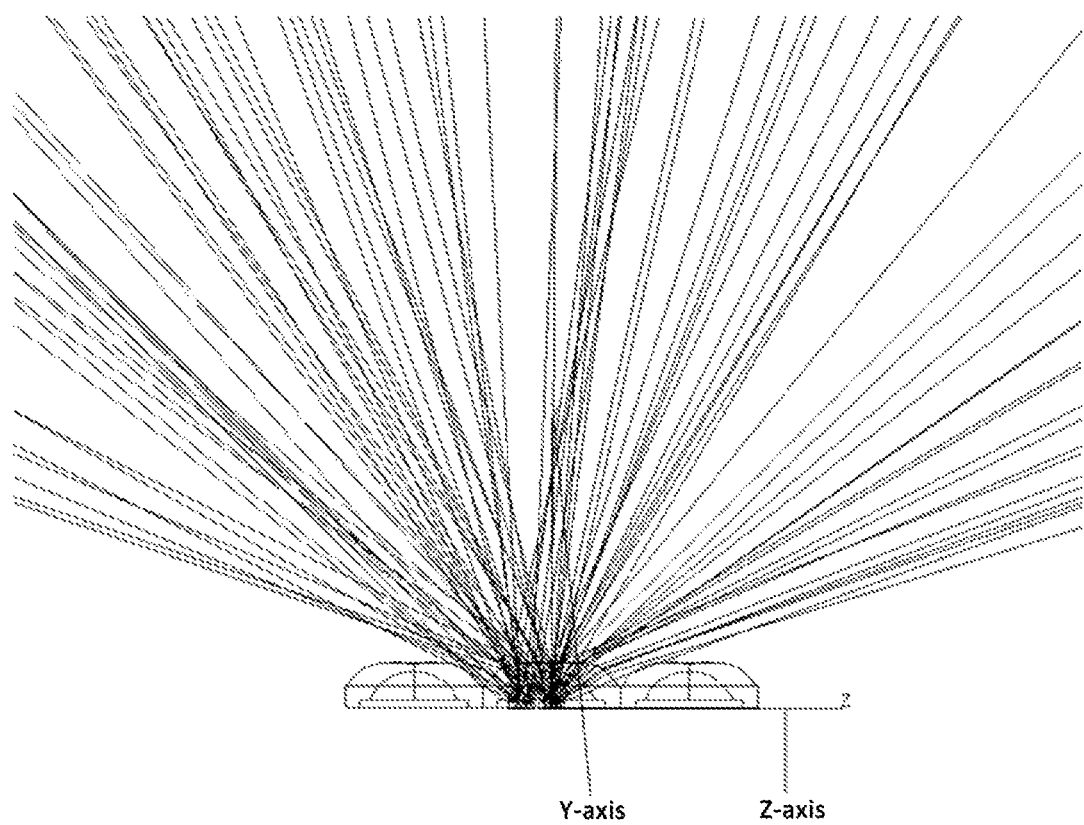
FIG. 9 is a light distribution diagram when the first light-emitting chips and the second light-emitting chips are lit simultaneously.

FIG. 1 is a schematic structural diagram of an optical module according to an embodiment of the present invention, FIG. 2 is a sectional view of the optical module according to an embodiment of the present invention, FIG. 3 is a sectional view of the optical module according to another embodiment of the present invention, FIG. 4 is a diagram illustrating a light intensity distribution of light refracted by lenses 2 when the first light-emitting chips 31 are lit alone, FIG. 5 is a light distribution diagram when the first light-emitting chips 31 are lit alone, FIG. 6 is a diagram illustrating the light intensity distribution of light refracted by lenses 2 when the second light-emitting chips 32 are lit alone, FIG. 7 is a light distribution diagram when the second light-emitting chips 32 are lit alone, FIG. 8 is a diagram illustrating a light intensity distribution diagram of light refracted by lenses 2 when the first light-emitting chips 31 and the second light-emitting chips 32 are lit simultaneously, and FIG. 9 is a light distribution diagram when the first light-emitting chips 31 and the second light-emitting chips 32 are lit simultaneously. In FIG. 3, there are broken lines on left and right sides of the central axis 21, and a region between the two broken lines is an orthographic projection region of the first light-emitting chips 31. In FIG. 5, a Y-axis represents a bottom-up direction in a viewing angle of FIG. 5, a Z-axis represents a left-right direction in the viewing angle of FIG. 5, and a X-axis, which is not illustrated, represents an outside-inside direction in the viewing angle of FIG. 5, a XZ plane is parallel to a top surface of the substrate 1, and the XYZ-axis in FIGS. 7 and 9 is identical with that in FIG. 5, which will not be repeated here. In FIG. 4, a line 1 indicates that the light emitted from the first light-emitting chips 31 is symmetrical about the Y-axis after being refracted by the lenses 2 on a XY plane of FIG. 5, and a line 2 indicates that the light emitted from the first light-emitting chips 31 is symmetrical about the Y-axis after being refracted by the lenses 2. In FIG. 6, a line 3 indicates that the light emitted from the second light-emitting chips 32 is symmetrical about the Z-axis after being refracted by the lenses 2 on the XY plane of FIG. 7, while a line 4 indicates that almost all of light are emitted in a negative direction of the Z-axis. In FIG. 8, a line 5 indicates that the light emitted from the second light-emitting chips 32 is symmetrical about the Y-axis after being refracted by the lenses 2 on the XY plane of FIG. 9, while a line 6 indicates that a small amount of light is emitted in a positive direction of the Z-axis and a large part of light is emitted in the negative direction of the Z-axis.

In an embodiment of the present invention, referring to FIGS. 1 to 3, the optical module comprises a substrate 1, lenses 2 and optical components 3;

the substrate 1 comprises mounting portions 11;

the lenses 2 cover the mounting portions 11, the lenses 2 having a central axis 21 perpendicular to a surface of the mounting portions 11, central cross sections of the lenses 2 along the central axis 21 being arc-shaped surfaces;

the optical components 3 comprise first light-emitting chips 31 at an intersection of the central axis 21 and the mounting portions 11, and second light-emitting chips 32 disposed between the first light-emitting chips 31 and a periphery of the lenses 2, the first light-emitting chips 31 and the second light-emitting chips 32 being configured to be independently activable.

Specifically, in the present embodiment, the substrate 1 may be a printed circuit board (PCB), a metal substrate 1, a ceramic substrate 1, or other material suitable for mounting light-emitting chips. The mounting portions 11 are a region on the substrate 1 specifically designed for mounting the optical components 3, and may comprise pads, grooves, or other fixing structures. The lenses 2 may be an optical element made of optical grade plastic (such as polycarbonate or acrylic) or glass. The central axis 21 is an imaginary straight line for defining a center of the lenses 2. The light-emitting chips (the first light-emitting chips 31 or the second light-emitting chips 32) of the optical components 3 may be LED chips or another type of light-emitting chips, such as an organic light-emitting diode (OLED) or a quantum dot light-emitting diode.

The first light-emitting chips 31 may be fixed to the mounting portions 11 by means of welding, conductive adhesive or crimping, etc., so that positions of the first light-emitting chips coincide with the intersection of the central axis 21. The second light-emitting chips 32 may also be fixed at a position between the first light-emitting chips 31 and the periphery of the lenses 2 by means of welding, conductive adhesive or crimping, etc. The two light-emitting chips are connected by independent circuits or control systems to realize a function of independently activatable.

It should be explained that the central cross section refers to an arbitrary plane perpendicular to the substrate 1 comprising the central axis 21, on which contours of the lenses 2 take on an arc-shaped shape.

When the first light-emitting chips 31 (located on the central axis 21) are lit alone, light is emitted mainly through a central portion of the lenses 2 because the first light-emitting chips 31 are located at a center position of the lenses 2. This arrangement allows rays to be symmetrically distributed around the lenses 2, creating a uniform pattern of luminescence, creating a distribution of a light field that is symmetrical to the central axis. When the second light-emitting chips 32 (located between the first light-emitting chips 31 and the periphery of the lenses 2) are illuminated alone, light emitted by the second light-emitting chips 32 is mainly emitted through an off-center portion of the lenses 2. This asymmetrical arrangement causes light to be concentrated mainly on one side of the lenses, creating a directional, asymmetrical light field distribution. This distribution is in sharp contrast to the symmetrical distribution when the first light-emitting chips 31 are lit alone, providing a completely different pattern of light emission. When the first light-emitting chips 31 and the second light-emitting chips 32 are lit simultaneously, two different light field distributions are superimposed and influenced on each other. A symmetrical light field provided by center chips combines with an asymmetrical light field provided by edge chips, resulting in a more complex and unique light field distribution. This combined effect provides users with a third unique lighting mode, which is significantly different in light intensity distribution and coverage than when a single chip is lit.

The diversity of this light emission mode is mainly determined by shapes of the lenses 2 and positions of the chips. Central sections of the lenses along the central axis are arc-shaped surfaces, with a change of curvature from a center portion to an edge portion affecting the way light is refracted. Different refraction effects are created when light sources at different locations pass through different parts of the lenses 2, resulting in different light field distributions. In addition, since two chips can be activated independently, users can flexibly adjust the light emission mode without changing the lenses 2 or using complex mechanical structures. This design not only overcomes limitation of a single light emission mode of traditional single LED lamp, but also avoids high cost and volume problems caused by using multiple LED lamps or complex mechanical structures, which provides an efficient and flexible solution for diverse lighting requirements, achieving a variety of different lighting effects by a single optical module.

In some embodiments, the number of the second light-emitting chips 32 may be two or more without specific limitation.

Optionally, thicknesses of the lenses 2 gradually increase from the central axis 21 toward a periphery direction of the lenses 2. Specifically, the thicknesses of the lens 2 refer to a distance from an inner surface to an outer surface of the lenses 2. The periphery refers to a periphery region of the lenses 2. A change in the thicknesses of the lenses 2 is a continuous process, gradually increasing from a center portion to an outside portion.

When light rays pass through a thinner portion of the center of the lenses 2, the light rays can pass almost directly without significant refraction due to a small thickness of materials, which is beneficial to maintain an original direction and intensity of the light rays emitted by the first light-emitting chips 31. This design ensures that the light rays in a central area can maintain a high transmittance and directivity, which is suitable for producing a concentrated beam. In contrast, when light passes through a thicker portion of the periphery of the lenses 2, it will undergo a longer optical path. This extended optical path allows the light rays to travel an increased distance through materials of the lenses 2, thereby increasing an opportunity for the light rays to interact with the materials. In this process, the change in curvature of the surface of the lenses 2 (due to an increase in thickness) will have a more pronounced refractive effect on light. A gradual change of the thickness of the lenses 2 can also smoothly adjust refraction effects of different areas, avoiding a sudden change of the direction of light, thereby reducing the generation of optical distortion and stray light. Through this design, the optical module more accurately control a light path from the light-emitting chips at different positions, and effectively control a direction of peripheral light while maintaining the directness of central light. This design of thickness distribution enables single lenses 2 not only to meet different optical requirements for light sources at different positions, but also to provide a structural basis for realizing diversified light field distributions. Ultimately, this design enables the optical module to achieve multiple light emission modes in a single structure, which can not only produce a concentrated light beam, but also create a wide-angle lighting effect, and even create more complex and flexible light field distribution through a combination of two chips to meet a variety of different lighting requirements.

It should be noted that the above description should not be regarded as limiting the design of the present application, and in other embodiments, the lenses 2 may be designed with a single thickness.

Optionally, the lenses 2 comprise inner arcuate surfaces 22 and outer arcuate surfaces 23 opposite to each other, the inner arcuate surfaces 22 being disposed close to the mounting portions 11 relative to the outer arcuate surfaces 23;

the inner arcuate surfaces 22 are spherical surfaces, and a curvature of the outer arcuate surfaces 23 gradually increases from the central axis 21 toward the periphery direction of the outer arcuate surfaces 23.

It will be understood that the inner arcuate surfaces 22 and the outer arcuate surfaces 23 refer to two main optical surfaces of the lenses 2. The inner arcuate surfaces 22 are surfaces close to the mounting portions 11 and directly face the light-emitting chips; The outer arcuate surfaces 23 are surfaces away from the mounting portions 11 and face a direction in which the light rays emit. A spherical surface is a curved surface with a constant radius of curvature.

First, the inner arcuate surfaces 22 are spherically designed to provide an ideal initial refractive interface. When light is emitted from the light emitting chips into the lenses 2, the spherical surface is capable of providing a consistent refraction effect for light at all incident angles. The spherical surface can maintain spatial distribution characteristics of light from chips to a greatest extent, and reduce the distortion caused by initial refraction. In contrast, if the inner arcuate surfaces 22 also adopt a varying curvature, the inner arcuate surfaces 22 may cause different regions of light to undergo different degrees of initial refraction, which may make subsequent light field control more complex and difficult to predict. Secondly, designing the inner arcuate surfaces 22 as a spherical surface simplifies the complexity of an overall optical system. In optical design, simplifying some elements can make a role of others more prominent and controllable. By maintaining the simplicity of the inner arcuate surfaces 22, designers can focus more attention on curvature changes of the outer arcuate surfaces 23, which makes fine control of light easier to achieve. A gradual design of the curvature of the outer arcuate surfaces 23 has become a main tool for shaping light fields, which can more flexibly adjust refraction effects of different areas, thereby achieving precise control of light emitted by the light emitting chips at different positions.

In addition, spherical inner arcuate surfaces 22 are also beneficial to improve the accuracy and efficiency of manufacturing. Spherical surface is a common and mature shape in optical manufacturing, which can be produced efficiently through standardized process flow. In contrast, if the inner arcuate surfaces 22 also employ a varying curvature, it will greatly increase the difficulty and cost of manufacturing. By simplifying the design of the inner arcuate surfaces 22, the manufacturing accuracy of the more critical outer arcuate surfaces 23 can be centrally controlled.

Optionally, a color temperature of the first light-emitting chips 31 and the color temperature of the second light-emitting chips 32 are different from each other.

In the present embodiment, the color temperature is a parameter describing a color characteristic of light emitted by light sources, which is generally expressed in Kelvin (K). Low color temperatures (e.g. 2700 K-3000 K) produce warm white light, similar to traditional incandescent lamps; High color temperatures (e.g. 5000 K-6500 K) produce cool white light, closer to natural daylight. It should be emphasized that "different color temperatures from each other" does not just mean a slight difference, but means that the color temperatures of the two chips are obviously different, usually at least 1000K, to produce obvious visual effects in practical applications.

Light sources with different color temperatures can create different lighting atmospheres and visual effects. For example, when only the lower color temperature chip is activated, warm, comfortable light can be produced, suitable for resting and relaxing environments. Activating a chip with a higher color temperature can produce bright and refreshing light, which helps to improve alertness and work efficiency. Secondly, by independently controlling two chips with different color temperatures, the function of dynamically adjusting the color temperature of light can be realized. This dynamic adjustment can simulate changes in natural light throughout one day, helping to regulate the body's circadian rhythm, for example, gradually increasing the color temperature in the morning to help people wake up and lowering the color temperature at night to promote sleep. In addition, a combination of two chips with different color temperatures can produce color temperatures in between, thus enabling a wider range of color temperature adjustment.

Optionally, the substrate 1 has a plurality of the mounting portions 11 on a same side surface;
  numbers of the lenses 2 correspond exactly to the numbers of the mounting portions 11, with each lens 2 covering each corresponding mounting portion 11;
  the numbers of the plurality of optical components 3 correspond exactly to the numbers of the mounting portions 11, each first light-emitting chip 31 of each optical component 3 is mounted at the intersection of the central axis 21 of a corresponding lens 2 and the corresponding mounting portion 11, and each second light-emitting chip 32 of each optical component 3 is mounted between the central axis 21 of the corresponding lens 2 and the periphery of the corresponding lens 2.

Specifically, an arrangement of the plurality of mounting portions 11 on a same side surface of the substrate 1 may adopt a variety of ways, such as a matrix arrangement, a ring arrangement, or an irregular arrangement designed according to specific requirements.

The integration of a plurality of optical components 3 on a single substrate 1 significantly improves the integration and compactness of an overall lighting system. Compared with using multiple independent lighting units, this design can greatly reduce required space and materials, lowering manufacturing and installation costs. Optionally, the lenses 2 comprise central light condensing portions 24 overlapping with orthographic projections of the first light emitting chips 31 on the substrate 1 and central light condensing portions 25 connected to the central light condensing portions 24 and the substrate 1, respectively, surfaces of the central light condensing portions 24 are provided with light condensing microstructures 241, and surfaces of the peripheral diffusing portions 25 are provided with diffusion microstructures 251; the light condensing microstructures 241 are configured to refract and converge light beams irradiated on the central light condensing portions 24 to the central axis 21, and the diffusion microstructures 251 is configured to refract and deviate light beams irradiated on the peripheral diffusing portions 25 from the central axis 21.

Specifically, the central light condensing portions 24 and the central light condensing portions 25 are two regions with different functions on the lenses 2. The central light condensing portions 24 are located in a central region of the lenses 2, and the peripheral diffusing portions 25 are located in a peripheral region of the lenses 2. The light condensing microstructures 241 and the diffusion microstructures 251 are special optical structures designed on surfaces of these two regions for controlling a propagation direction of light.

The light condensing microstructures 241 has various embodiments, in particular, in some embodiments, the light condensing microstructures 241 comprise condensing annular grooves 241a surrounding the central axis 21, groove wall surfaces of the condensing annular grooves 241a comprise condensing inner annular surfaces 241b and condensing outer annular surfaces 241c opposite to each other, the condensing inner annular surfaces 241b are disposed opposite to the condensing outer annular surfaces 241c and close to the central axis 21;
  the condensing outer annular surfaces 241c are inclined in a direction close to the central axis 21 in a direction from a bottom portion to an opening portion of the condensing annular grooves 241a, and the condensing inner annular surfaces 241b are inclined in a direction perpendicular to a surface of the mounting portions 11 or away from the central axis 21 in the direction from the bottom portion to the opening portion of the condensing annular grooves 241a.

Specifically, the condensing annular grooves 241a are annular structures provided around the central axis 21. The groove wall surface of the condensing annular grooves 241a refers to an inner surface of the condensing annular grooves 241a. It should be noted that, in some embodiments, when the number of condensing annular grooves 241a is multiple, the condensing outer annular surfaces 241c, the bottom portion and the opening portion in the sentence "the condensing outer annular surfaces 241c are inclined in a direction close to the central axis 21 in a direction from a bottom portion to an opening portion of the condensing annular grooves 241a" are formed by a same condensing annular groove 241a, and are not formed by different condensing annular groove 241a.

According to the present invention, the condensing annular grooves 241a are preferentially provided on the outer arcuate surfaces 23 of the lenses 2 to avoid damage to the inner arcuate surfaces 22 and ensure that the inner arcuate surfaces 22 can provide a consistent refraction effect for light at all incident angles (beneficial effects of this design have been discussed above and will not be repeated).

The condensing outer annular surfaces 241c are inclined in a direction close to the central axis 21 in a direction from a bottom portion to an opening portion of the condensing annular grooves 241a, which means that the outer annular surface gradually approaches the central axis 21 from the bottom portion to the opening portion. The condensing inner annular surfaces 241b can be arranged in two ways: perpendicular to the surface of the mounting portions 11, forming a right-angled groove wall; or being inclined in a direction away from the central axis 21.

After being emitted from the first light-emitting chips 31 or the second light-emitting chips 32, the light first passes through the inner arcuate surface 22 of the lenses 2 and enters the material of the lenses 2. Inside the lenses 2, the light continues to propagate until reaching a bottom wall of the condensing annular groove 241a. When passing through the bottom wall of the condensing annular groove 241 a, the light enters air with a low refractive index from the material of the lenses with a high refractive index (inside portions of the condensing annular groove 241 is filled with air), at which time a first refraction occurs. After entering the inside portion of the groove, the light continues to travel through the air. A portion of the light rays will emit directly through the opening portion of the groove, while another portion of the light rays will irradiate the condensing outer annular surfaces 241c. Since the condensing outer annular surfaces 241c are inclined in a direction close to the central axis 21 in a direction from a bottom portion to an opening portion of the condensing annular grooves 241a, a second refraction occurs when the light encounters this inclined interface. This refraction deflects the light rays toward the central axis 21, thereby achieving the effect of converging the light rays toward the central axis 21. This double refraction process is particularly important for light from the second light-emitting chips 32 because the light might otherwise diverge outwardly. Through this ingenious structural design, these light rays are effectively directed to converge towards the central axis 21. Meanwhile, the design of the diffusion inner annular surface 241b also plays an important role. When it is perpendicular to the surface of the mounting portions 11, an original direction of the light from the central region, especially the first light-emitting chips 31, is maintained mainly. However, when the condensing outer annular surfaces 241c are inclined away from the central axis 21, the light rays close to the center can be fine-tuned to prevent these light rays from converging excessively on the central axis 21 and avoid forming excessively concentrated hot spots.

It is particularly noteworthy that the condensing inner annular surfaces 241b are not inclined in a direction close to the central axis 21 in a direction away from the mounting portions 11, This is because such a design may cause total internal reflection of incident light at certain angles (light rays move to the condensing inner annular surface in the lenses 2 and are reflected back into the lenses 2 by back surfaces of the condensing inner annular surfaces 241b). Instead, this results in inability to use it without the lenses 2, reducing the efficiency of light utilization.

In another embodiment of the light condensing microstructure 241, an inclined wall may be provided on the outer arcuate surfaces 23 of the lenses 2, and the inclination direction of the inclined wall may be substantially the same or completely the same as that of the light-condensing outer arcuate surfaces 23.

Optionally, the condensing inner annular surfaces 241b and the condensing outer annular surfaces 241c are both planar;

when the condensing inner annular surfaces 241b are inclined in a direction away from the central axis 21 in the direction from the bottom portion to the opening portion of the condensing annular grooves 241a, an included angle between the condensing inner annular surfaces 241b and the central axis 21 is smaller than an included angle between the condensing outer annular surfaces 241c and the central axis 21.

Specifically, the condensing inner annular surfaces 241b and the condensing outer annular surfaces 241c are designed to be planar rather than curved surfaces. This planar design can be achieved by methods such as precision mold forming or CNC machining. Compared with curved surfaces, it is easier to control the accuracy in the manufacturing process through the planar design, and it also simplifies the calculation and prediction of light path.

The "included angle" in this embodiment refers to an acute angle formed between the central axis 21 (supposedly translated to intersect with planes) and these planes. When the condensing inner annular surfaces 241b are inclined in a direction away from the central axis 21 in the direction away from the mounting portions 11, an included angle between the condensing inner annular surfaces 241b and the central axis 21 is smaller than an included angle between the condensing outer annular surfaces 241c and the central axis 21, which means that a degree of inclination of the condensing outer annular surfaces 241c compared with the central axis 21 is greater. After the light enters the condensing annular grooves 241a from the material of the lenses 2, a portion of the light will encounter these two inclined planes. Since an inclination angle of the condensing inner annular surfaces 241b is small, it has a relatively mild effect on the light. When the light contacts the condensing inner annular surfaces 241b, a slight refraction occurs, slightly changing the light path. This fine-tuning action helps to prevent excessive concentration of light towards the center, avoiding the formation of excessively concentrated hot spots near the central axis 21, while substantially maintaining the original direction of light from the central region. In contrast, the larger inclination angle of the condensing outer annular surfaces 241c allows it to produce a more significant refractive effect on the incident light. When the light ray encounters the condensing outer annular surfaces 241c, a greater degree of refraction occurs, causing the light ray to be significantly deflected toward the central axis 21.

A difference in the inclination angle of the two planes creates a progressive light control system. Light near the center undergoes less directional adjustment, while light away from the center is subject to more intense refraction. This design not only achieves the overall light gathering effect, but also maintains the uniformity of the light field distribution. By fine-tuning the inclination angle of the two faces, different light field effects from highly focused to lightly divergent can be achieved to meet various lighting requirements. For example, increasing the inclination angle of the condensing outer annular surfaces 241c can enhance the condensing effect, while decreasing the inclination angle can achieve a more uniform light distribution.

Optionally, the diffusion microstructures 251 comprise diffusion annular grooves 251a surrounding the central axis 21, groove wall surfaces of the diffusion annular grooves 251a comprise diffusion inner annular surfaces 251b and diffusion outer annular surfaces 251c opposite to each other, and the diffusion inner annular surfaces 251b are disposed opposite to the diffusion outer annular surfaces 251c and close to the central axis 21;

the diffusion outer annular surfaces 251c are inclined in a direction away from the central axis 21 in a direction from a bottom portion to an opening portion of the diffusion annular grooves 251a, and the diffusion inner annular surfaces 251b are inclined in a direction perpendicular to a surface of the mounting portions 11 or in a direction away from the central axis 21 in a direction from the bottom portion to the opening portion of the condensing annular grooves 251a.

Specifically, the diffusion annular grooves 251a are an annular structure provided around the central axis 21, and is similar to the condensing annular grooves 241a, but has different functions and design objectives. It should be noted that when there are multiple diffusion annular grooves 251a, the diffusion outer annular surface 251c, the groove bottom and the groove opening in "the diffusion outer annular surfaces 251c are inclined in a direction away from the central axis 21 in a direction from a bottom portion to an opening portion of the diffusion annular grooves 251a" are formed by the same diffusion annular grooves 251a, rather than by different diffusion annular grooves 251a.

When the light enters the diffusion annular groove 251a from the lenses 2 material, it first passes through the interface at the bottom portion of the diffusion annular grooves 251a and undergoes the first refraction. After that, the light propagates inside the diffusion annular grooves 251a, part of the light is directly emitted from the top portion of the diffusion annular grooves 251a, and the other part of the light encounters the diffusion outer annular surfaces 251c and the diffusion inner annular surfaces 251b. Since the diffusion outer annular surfaces 251c are inclined away from the central axis 21, when the light encounters this interface, it will be refracted outwards. This refraction guides the light that may originally converge toward the center outwards, achieving a light diffusion effect.

The design of the diffusion inner annular surface 251b also plays an important role. When it is perpendicular to the surface of the mounting portion 11, it can maintain the original direction of part of the light and prevent excessive diffusion; when it is also tilted away from the central axis 21, it can further enhance the diffusion effect, but the degree of inclination is usually less than that of the outer annular surface to maintain a certain light control.

The advantage of this design is that it can effectively disperse light that might have been concentrated, creating a more uniform, wider-angle lighting effect. It is particularly suitable for scenes that require large-area, soft lighting, such as indoor ambient lighting or display lighting. By carefully designing the inclination angles of the inner and outer ring surfaces, different light field effects from mild diffusion to high uniformity can be achieved. In addition, this structure can also reduce glare and improve visual comfort because it can convert direct light from strong light sources into softer diffused light.

Further, outward from the central axis 21, a plurality of condensing annular grooves 241a may be provided, followed by a plurality of diffusion annular grooves 251a. This progressive layout enables a smooth transition from highly focused at the center to uniform diffusion at the edges. The width and depth of each groove may gradually increase outward from the central axis 21 (toward the periphery of the lenses 2), for example, innermost condensing grooves may have a width of 0.2 mm and a depth of 0.1 mm, while outermost diffusing grooves may reach a width of 0.5 mm and a depth of 0.3 mm. This design helps to compensate for the increase in the distance traveled by the light, ensuring a balanced optical effect across the surface of the lenses 2.

Secondly, a special coating may be applied to the surface of the grooves (condensing annular grooves 241a or diffusion annular groove 251a) to enhance optical properties. On the outer annular surface of the condensing annular grooves 241a, a high-reflectivity metal coating, such as aluminum or silver, may be used to improve the reflection efficiency of light and further enhance the light-condensing effect. When the lenses 2 are provided with a plurality of diffusion annular grooves 251a, the diffusion annular grooves 251a closest to the periphery of the lenses 2 among the plurality of diffusion annular grooves 251a are defined as a distal diffusion annular groove 251a. Based on this embodiment, the present invention also provides a method for preparing an optical module, specifically, the method for preparing an optical module comprises:

S1: providing a bottom plate having a plurality of mounting portions 11 on a top surface of which the first light-emitting chips 31 and the second light-emitting chips 32 are mounted;

S2: installing an intermediate plate on the bottom plate, wherein the intermediate plate is penetrated with a plurality of mounting via holes, numbers of the plurality of mounting via holes is corresponding with the number of the plurality of mounting portions 11, a diameter of the mounting via holes is greater than or equal to a longest dimension of the periphery of the lenses 2 (when the lenses 2 are spherical, the longest dimension is the diameter of the periphery of the lenses 2, and when the lenses 2 are an irregular shape, the longest dimension refers to the distance between two points on the periphery of the lenses 2 that are farthest from each other), and an inner peripheral wall of the mounting via holes and a top surface of the bottom plate jointly define a mounting groove;

S3: installing the plurality of lenses 2 in installation grooves respectively, with the bottom surface of the lenses 2 abutting against the top surface of the bottom plate; S4: providing multiple pressure strips, which can be inserted into terminal diffusion annular grooves 251a, inserting one end of the pressure strip into the diffusion annular grooves 251a, and making a bottom portion of the pressure strips abut against the diffusion outer annular surfaces 251c of the corresponding terminal diffusion annular grooves 251a, and making an end face of the pressure strips abut against the bottom portion of the terminal diffusion annular grooves 251a and then, fixing and bonding the pressure strips to sides of an intermediate plate facing away from the bottom plate.

Specifically, the bottom plate, the intermediate plate and the plurality of pressure strips in this method together constitute the substrate 1 described above.

The optical module is prepared by this method, and a feature that the lenses 2 has the terminal diffusion annular grooves 251a is utilized, and the pressure strips and the groove wall of the terminal diffusion annular grooves 251a are mutually limited to realize limit of the lenses 2, preventing the lenses 2 from moving in a direction perpendicular to the bottom plate or in a direction parallel to surfaces of the bottom plate, and ensuring stable installation of the lenses 2.

Further, in order to ensure mounting stability of the lenses 2, in step S3, bottom surfaces of the lenses 2 are adhesively connected with top surfaces of the bottom plate, and gaps between the lenses 2 and inner peripheral walls of the corresponding mounting via holes are filled with plastic material.

The present invention also proposes an optical device, the optical device comprising an optical module, the specific structure of the optical module referring to the above embodiments. Since adopting all the technical solutions of all the above embodiments, the present optical device has at least all the beneficial effects arising from the technical solutions of the above embodiments, which will not be repeated.

The above description is only a preferred embodiment of the present invention, and does not limit the scope of the present invention. Any equivalent structural transformation made by the contents of the specification and drawings of the present invention under the inventive concept of the present invention, or directly/indirectly applied to other related technical fields, is included in the patent protection scope of the present invention.

What is claimed is:

1. An optical module comprising:
   a substrate (1) comprising mounting portions (11);
   lenses (2) covering the mounting portions (11), the lenses (2) having a central axis (21) perpendicular to a surface of the mounting portions (11), central cross sections of the lenses (2) along the central axis (21) being arc-shaped surfaces;
   optical components (3) comprising first light-emitting chips (31) at an intersection of the central axis (21) and the mounting portions (11), and second light-emitting chips (32) disposed between the first light-emitting chips (31) and a periphery of the lenses (2), the first light-emitting chips (31) and the second light-emitting chips (32) being configured to be independently activable;
   wherein the lenses (2) comprise central light condensing portions (24) overlapping with orthographic projections of the first light emitting chips (31) on the substrate (1) and peripheral diffusing portions (25) connected to the central light condensing portions (24) and the substrate (1), respectively, surfaces of the central light condensing portions (24) are provided with light condensing microstructures (241), and surfaces of the peripheral diffusing portions (25) are provided with diffusion microstructures (251);
   the light condensing microstructures (241) are configured to refract and converge light beams irradiated on the central light condensing portions (24) to the central axis (21), and the diffusion microstructures (251) are configured to refract and deviate light beams irradiated on the peripheral diffusing portions (25) from the central axis (21);
   wherein the light condensing microstructures (241) comprise condensing annular grooves (241a) surrounding the central axis (21), groove wall surfaces of the condensing annular grooves (241a) comprise condensing inner annular surfaces (241b) and condensing outer annular surfaces (241c) opposite to each other, the condensing inner annular surfaces (241b) are disposed opposite to the condensing outer annular surfaces (241c) and close to the central axis (21);
   the condensing outer annular surfaces (241c) are inclined in a direction close to the central axis (21) in a direction from a bottom portion to an opening portion of the condensing annular grooves (241a), and the condensing inner annular surfaces (241b) are inclined in a direction perpendicular to a surface of the mounting portions (11) or away from the central axis (21) in the direction from the bottom portion to the opening portion of the condensing annular grooves (241a);
   wherein the condensing inner annular surfaces (241b) and the condensing outer annular surfaces (241c) are both planar;
   when the condensing inner annular surfaces (241b) are inclined in a direction away from the central axis (21) in the direction from the bottom portion to the opening portion of the condensing annular grooves (241a), an included angle between the condensing inner annular surfaces (241b) and the central axis (21) is smaller than an included angle between the condensing outer annular surfaces (241c) and the central axis (21);
   wherein the diffusion microstructures (251) comprise diffusion annular grooves (251a) surrounding the central axis (21), groove wall surfaces of the diffusion annular grooves (251a) comprise diffusion inner annular surfaces (251b) and diffusion outer annular surfaces (251c) opposite to each other, and the diffusion inner annular surfaces (251b) are disposed opposite to the diffusion outer annular surfaces (251c) and close to the central axis (21);
   the diffusion outer annular surfaces (251c) are inclined in a direction away from the central axis (21) in a direction from a bottom portion to an opening portion of the diffusion annular grooves (251a), and the diffusion inner annular surfaces (251b) are inclined in a direction perpendicular to a surface of the mounting portions (11) or in a direction away from the central axis (21) in a direction from the bottom portion to the opening portion of the condensing annular grooves (251a);
   wherein thicknesses of the lenses (2) gradually increase from the central axis (21) toward a periphery direction of the lenses (2);
   wherein the lenses (2) comprise inner arcuate surfaces (22) and outer arcuate surfaces (23) opposite to each other, the inner arcuate surfaces (22) being disposed close to the mounting portions (11) relative to the outer arcuate surfaces (23);
   the inner arcuate surfaces (22) are spherical surfaces, and a curvature of the outer arcuate surfaces (23) gradually increases from the central axis (21) toward the periphery direction of the outer arcuate surfaces (23);
   wherein a method for preparing an optical module comprises:
   S1: providing a bottom plate having a plurality of mounting portions (11) on a top surface of which the first light-emitting chips (31) and the second light-emitting chips (32) are mounted;
   S2: installing an intermediate plate on the bottom plate, wherein the intermediate plate is penetrated with a plurality of mounting via holes, numbers of the plurality of mounting via holes is corresponding with the number of the plurality of mounting portions (11), a diameter of the mounting via holes is greater than or equal to a longest dimension of the periphery of the lenses (2), and an inner peripheral wall of the mounting via holes and a top surface of the bottom plate jointly define a mounting groove;
   S3: installing the lenses (2) in installation grooves respectively, with the bottom surface of the lenses (2) abutting against the top surface of the bottom plate;
   S4: providing multiple pressure strips, which can be inserted into terminal diffusion annular grooves (251a), inserting one end of the pressure strip into the diffusion annular grooves (251a), and making a bottom portion of the pressure strips abut against the diffusion outer annular surfaces (251c) of the corresponding terminal diffusion annular grooves (251a), and making an end face of the pressure strips abut against the bottom portion of the terminal diffusion annular grooves (251a) and then, fixing and bonding the pressure strips to sides of an intermediate plate facing away from the bottom plate the bottom plate, the intermediate plate and the pressure strips jointly form the substrate (1).

2. The optical module according to claim 1, wherein a color temperature of the first light-emitting chips (31) and a color temperature of the second light-emitting chips (32) are different from each other.

3. The optical module according to claim 1, wherein the substrate (1) has a plurality of the mounting portions (11) on a same side surface;
- numbers of the lenses (2) correspond exactly to the numbers of the mounting portions (11), with each lens (2) covering each corresponding mounting portion (11);
- the numbers of the plurality of optical components (3) correspond exactly to the numbers of the mounting portions (11), each first light-emitting chip (31) of each optical component (3) is mounted at the intersection of the central axis (21) of a corresponding lens (2) and the corresponding mounting portion (11), and each second light-emitting chip (32) of each optical component (3) is mounted between the central axis (21) of the corresponding lens (2) and the periphery of the corresponding lens (2).

4. An optical device comprising an optical module according to claim 1.

* * * * *